United States Patent [19]
Lee et al.

[11] Patent Number: 5,115,442
[45] Date of Patent: May 19, 1992

[54] TOP-EMITTING SURFACE EMITTING LASER STRUCTURES

[75] Inventors: Yong H. Lee, Middletown; Benjamin Tell, Matawan, both of N.J.

[73] Assignee: AT&T Bell Laboratories, Murray Hill, N.J.

[21] Appl. No.: 509,653

[22] Filed: Apr. 13, 1990

[51] Int. Cl.$^5$ .............................................. H01S 3/19
[52] U.S. Cl. ...................................... 372/45; 372/96; 357/4; 437/129
[58] Field of Search ................. 372/45, 96; 351/4, 17; 437/129

[56] References Cited

U.S. PATENT DOCUMENTS

| | | | |
|---|---|---|---|
| 4,819,048 | 4/1989 | Mand et al. | 372/45 |
| 4,943,970 | 7/1990 | Bradley | 372/45 |
| 4,949,350 | 8/1990 | Jewell et al. | 372/45 |
| 4,949,351 | 8/1990 | Imanaka et al. | 372/45 |

FOREIGN PATENT DOCUMENTS

| | | | |
|---|---|---|---|
| 0083389 | 5/1985 | Japan | 372/45 |
| 0086883 | 4/1987 | Japan | 372/45 |
| 0278292 | 11/1988 | Japan | 372/45 |

OTHER PUBLICATIONS

M. Born, E. Wolf–"Principles of Optics", Pergammon, N.Y. (1964), p. 51.
J. P. Van der Ziel, M. Ilegems–Applied Optics, vol. 14, No. 11, (Nov. 1975), "Multilayer GaAs-Al$_{0.3}$Ga$_{0.7}$As dielectric quarter wave stacks grown by molecular beam epitaxy".
K. Iga et al.–"Electronics Letters, vol. 23, pp. 134–136, Jan. 29, 1987, Microcavity GaAlAs/GaAs Surface-Emitting Laser with I$_{th}$=6mA".
A. Ibaraki, et al–"Japanese Journal of Applied Physics", vol. 28, pp. L–667-L668 Apr. 1989 "Buried Heterostructure GaAs/GaAlAs Distributed Bragg Reflector Surface Emitting Laser . . . ".
Y. H. Lee–"Electronic Letters", vol. 25, pp. 1377-1378 Sep. 28, 1989, "Room Temperature Continuous-Wave Vertical Cavity Single Quantum Well Microlaser diode".
J. L. Jewell, et al–Optic. Engineering, vol. 290, p. 210 Mar. 1990, "Surface-emitting microlasers for platonic switching and inter chip connections".
R. D. Dupuis, et al, "Applied Physics Letters, vol. 31, p. 201 Aug. 1977 High-efficiency GaAlAs/GaAs heterostructure solar cells grown by metalorganic chemical vapor deposition".
A. Y. Cho, "J. Vac. Technology", vol. 8, p. 531 Jun. 1971, "Film Deposition by Molecular-Beam Techniques".
J. F. Ziegler, ed., "Ion Implantation-Science & Technology", Academic Press, pp. 51-108 (1984).
G. P. Agrawal, N. K. Dutta, "Long Wavelength Semiconductor Lasers", Reinhold, N.Y., (1986) ISBN #0-442-2-0995-9.
D. K. Ferry, H. W. Sams, Inc., ed., "GaAs Technology", Indianapolis, Ind. (1985) ISBN #0-672-22375-9.
M. Ogura et al, "Applied Physics Letters", vol. 54, p. 1655 Nov. 23, 1987 "Surface-emitting laser diode with verical Ga/As/GaAlAs 1/4 multilayer and lateral buried heterostructure".

Primary Examiner—Georgia Y. Epps
Attorney, Agent, or Firm—G. S. Indig

[57] ABSTRACT

Top surface emitting, vertical cavity, surface emitting lasers depend upon emission through apertured top surface electrodes. Biasing current, accordingly peripheral to the laser as introduced, follows a path which comes to confluence within the active gain region to effectively attain lasing threshold. The path is consequence of a buried region of increased resistance which encircles the laser at or above the active region. The buried region is produced by ion implantation-induced damage with ion energy magnitude and spectrum chosen to produce an appropriate resistance gradient. Integrated, as well as discrete, lasers are contemplated.

15 Claims, 2 Drawing Sheets

TOP-EMITTING SURFACE EMITTING LASER STRUCTURES

BACKGROUND OF THE INVENTION

1. Technical Field

The invention relates to electrically pumped, vertical cavity, surface emitting lasers which are top emitting. Such lasers may be discrete or may be included in integrated circuits as, for example, in laser arrays or in optoelectronic circuits.

2. Description of the Prior Art

The vertical cavity, surface emitting laser structure (SEL), is emerging as a promising solution to the recognized need for inexpensive, reliable laser structures. Its two-dimensional nature, with its very small active gain region volume translates into the low lasing threshold currents which relieve the problem of heat dissipation. While the SEL is certainly of interest, as a discrete device, it is regarded by many as a significant potential breakthrough in terms of integration—both all-optical and opto-electronic. Contemplated uses include optical switching/computing, photonic interconnection, high/-low power laser sources, image processing, neural networks, etc.

Reported structures have active regions based on gallium arsenide or indium gallium arsenide in the form of one or more quantum wells, or, alternatively, of bulk material. Efficient devices have placed active gain material, whether quantum wells or bulk, at positions corresponding with peak intensity values of the standing wave, with inert (non-gain) filler material elsewhere.

As the dimension of the active region is reduced in the lasing direction (to yield lowest lasing threshold values), increased cavity reflectance is needed to accommodate the correspondingly reduced per-pass gain. Needed reflectance values for each cavity end, generally 98+%, may be in the 99.4-99.9% range for low gain devices, with the latter value corresponding with the ultimate single quantum well structure. Such reflectance values generally depend upon distributed dielectric mirrors, sometimes referred to in terms of the prototypical distributed Bragg reflector (DBR). Such mirrors are made up of "periods" each including paired layers of material, transparent to and of different refractive index for the emission wavelength.

Design criteria of dielectric mirrors are well known. See, for example, M. Born and E. Wolf, "Principles of Optics", Pergammon, N.Y. (1964), p. 51 and J. P. Van der Ziel and M. Ilegems, "Applied Optics", vol. 14, no. 11, (Nov. 1975).

Reported structures for the most part are constructed by epitaxial growth on an inert substrate. A characteristic device is grown on silicon-doped n+ conductivity type gallium arsenide by molecular beam epitaxy (MBE). Initially grown material, in this instance n-doped alternating layers of e.g. aluminum arsenide and aluminum gallium arsenide, form the bottom dielectric mirror. Next comes the active region consisting of spacer (or barrier) regions embracing the active gain material. The top mirror, again alternating layers of material of differing refractive index, but this time p-doped completes the structure from the optical standpoint. Design details are adequately set forth in the literature. See K. Iga et al, "Electronics Letters", vol. 23, pp. 134-136 (1987); A. Ibaraki et al, "Japanese Journal of Applied Physics", vol. 28, pp. L667-L668 (1989). A single quantum well structure is described by Y. H. Lee et al in "Electronics Letters", vol. 25, pp. 1377-1378 (1989).

Electrically pumped structures, those of greatest interest for most uses, generally bias the active region through the mirrors, which as indicated above, are doped so as to result in the typical p-i-n configuration. Most devices have depended upon top electrodes, in-line with the lasing direction. While this is a convenient arrangement, such top electrodes are generally metallic and of such thickness as to preclude top emission, so that devices generally depend upon emission through the substrate. For (usual) GaAs substrates, the increased emission wavelength resulting from indium inclusion in the gain region (use of InGaAs active gain material) permits transmission without modification of the substrate. Use of GaAs active gain material (to which the substrate is absorbing) has been accommodated by etch-removal of in-line substrate.

A structural variation depends upon a "hybird" mirror on the p-type side of the cavity—a mirror including a conventional metallic reflecting layer supplemented by a dielectric mirror containing a lesser number of dielectric pairs. In this manner, the contribution of increased resistance, due to low hole mobility in the p-doped dielectric mirror layers is lessened while still realizing the high reflectance offered by the distributed dielectric structure.

Whether the top metal layer serves the simple function of electrode, or whether it serves as a portion of the mirror, the effect is the same—it is opaque to laser emission and so precludes top surface emission.

While the desirability of top surface emission has been recognized, for example, for use in expediently manufactured displays, structural approaches have been expensive. One approach, which relies upon lateral introduction of biasing current into the active region, uses etching, regrowth and diffusion. See M. Ogura et al., "Applied Physics Letters", vol. 51, p. 1655 (1987).

SUMMARY OF THE INVENTION

The invention is concerned with top surface emitting, vertical cavity, surface emitting lasers. Structures of the invention depend upon use of a (nonhybrid) distributed dielectric mirror on the upper cavity end. In-line electrodes are avoided by peripheral current injection which leaves the relevant portion of the top mirror unobstructed. Efficient current introduction into the active gain region is assured by a resistivity profile created by ion bombardment-induced crystalline damage (referred to herein as "ion implantation") Ideal waist-like profiling with the "waist" about or slightly above the active region is the consequence of choosing the ion mass and energy to result in the highest resistance at such a depth - referred to herein as "buried damage layer". While examples depend upon the generally preferred H+ (proton), since requiring least energy and having little harmful device consequence, other ions may serve. Preferred embodiments rely upon thermal annealing to lessen implantation damage at the heavily doped surface, and thereby to improve conductivity near the top of the upper mirror.

Preferred structures, in accordance with the invention, further minimize resistance at least within the upper mirror by use of known superlattice or step layers between dielectric mirror members or pairs. See J. L. Jewell et al, "Optic. Engineering", vol. 290, p. 210 (1990).

As in prior art structures, it continues to be convenient to p-dope the upper mirror. The invention approach, however, is suitably applied to the inverse structure in which the top mirror is n-doped.

DETAILED DESCRIPTION

FIG. 1

Figure 1:
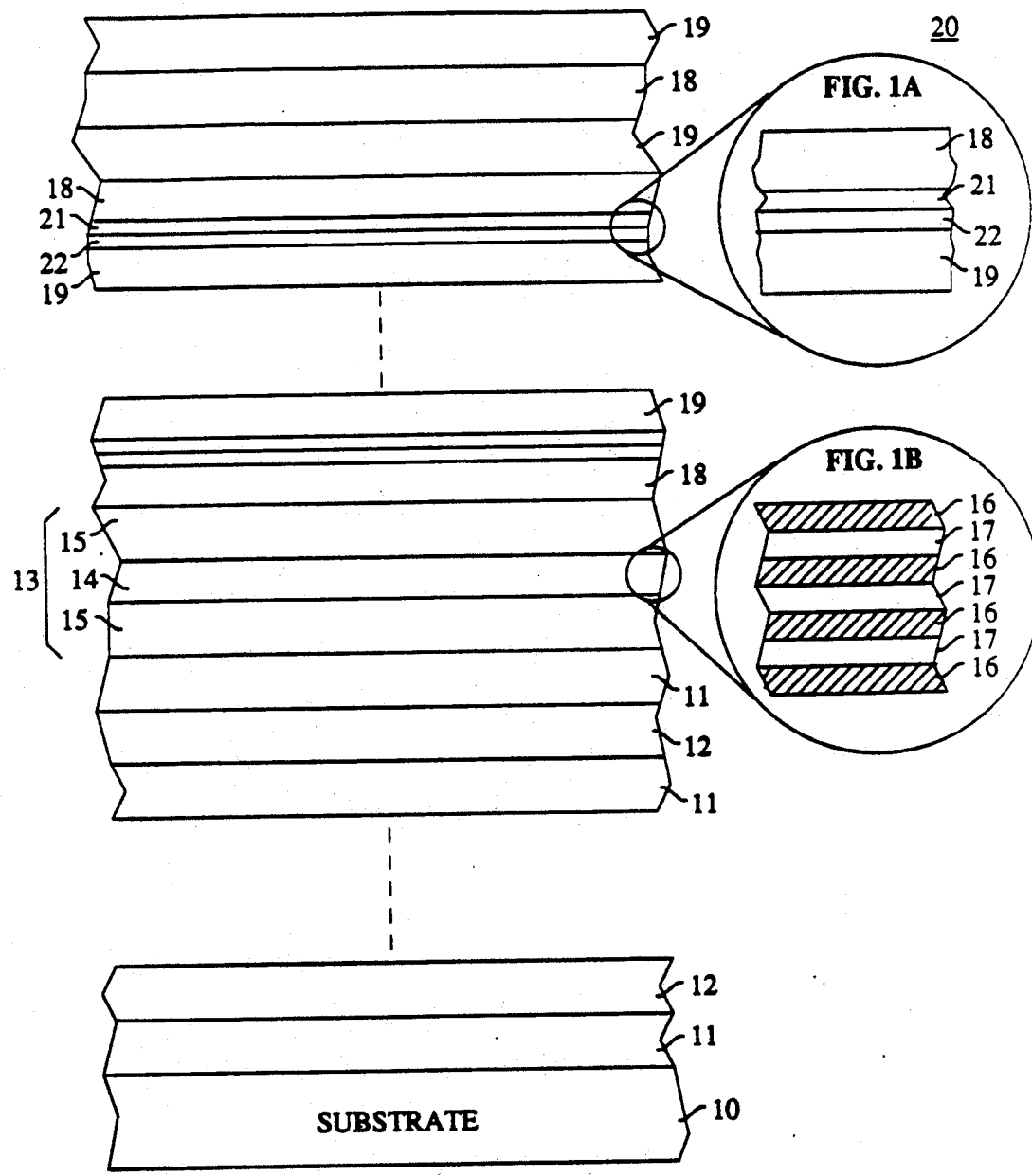
FIG. 1 is a schematic elevational view depicting a substrate and layered structure illustrative of those contemplated by the invention.

FIG. 1 serves as the basis for general discussion relating to design, materials, etc. as well as for specific discussion concerning an experimentally demonstrated working example.

This figure depicts the generally contemplated top surface emitting SEL. Choice of materials is ultimately dependent upon desired laser characteristics, e.g. emission wavelength. Substrate composition is, in the usual instance, independent of considerations relating to laser emission wavelength. Under certain circumstances, however, where emission on the substrate side of the cavity may be desired, e.g. to monitor top surface emission, it may still be desirable to choose a substrate which is appropriately transparent. In usual fabrication, which is dependent upon epitaxially growth, choice of substrate will entail lattice parameters, etc.

Operating devices, to date, have been epitaxially grown on a substrate 10, which in the working example is Si-doped $n^{30}$ GaAs (typically 200 to 500 $\mu$m thick, uniformly doped at $\approx 3 \times 10^{18}$ cm$^{-3}$). Epitaxial growth, initially of the n-type mirror layers, may be by metallo-organic chemical vapor deposition (MOCVD) (see R. D. Dupuis et al, *Appl. Phys. Letters*, Vol. 31, p. 201 (1978)), MBE (see A. Y. Cho, *J. Vac. Techno.*, Vol. 8, p. 531 (1971)), etc. For the working example, MBE was used to grow a 26.5 pair quarter-wave stack mirror having a reflectance peak corresponding with the 850 nm. emission wavelength. The bottom or n-type mirror consists of AlAs/Al$_{0.15}$Ga$_{0.85}$As (layers 11, 12 of 710.8 Å and 604.8 Å thickness, respectively). Both layers 11 and 12 are Si doped to $3 \times 10^{18}$ cm$^{-3}$.

FIG. 1 depicts an active region 13 consisting of an active gain region 14 sandwiched between two spacer layers 15. The overall thickness of region 13 is such as to support an integral number of half wavelengths of the laser emission as permitted by the band structure of the active gain material. Placement of the active gain region 14 at the center of active region 13 places it at a position of maximum intensity for the working example (which provided for a one wavelength standing wave). The precise dimension is, within permitted limits, determinative of the realized laser emission wavelength. For the particular working example, the active gain region 14 consisted of four GaAs layers 16 of approximate thickness 100 Å separated by 70 Å thick barrier layers 17 of Al$_{0.3}$Ga$_{0.7}$As (Al$_x$Ga$_{1-x}$As in which x=0.3). The sandwiching spacer layers 15 approximately 963 Å in thickness were also of Al$_x$Ga$_{1-x}$As with x=0.3 adjacent the active gain region 14 and graded to a value of 0.5 adjacent the innermost mirror layers 11 and 18. The graded composition within spacer regions 15 serves to confine carriers within the active gain region 14.

For brevity, the active region 13 is largely discussed in terms of one or a few quantum wells. The inventive teaching is equally applicable to bulk active gain regions, as well as, to active regions containing larger numbers of quantum wells.

In the example, the top mirror reflectance consisted of 19 periods of Be-doped mirror layers of AlAs 18 paired with Al$_{0.15}$Ga$_{0.85}$As layers 19. Useful conductivity characteristics in this example resulted from beryllium doping of $3 \times 10^{18}$ for the first two periods adjacent the active region through $5 \times 10^{18}$ for the next fourteen periods and increasing to a maximum level of $2 \times 10^{19}$ for the top layer. As shown in detailed view of a period 20, conductivity in the upper mirror is further increased by paired layers 21 and 22 of intermediate energy bandgaps within each 18, 19 dielectric pair. For the particular example, layer 21 (x=0.4) of thickness 95.5 Å and layer 22 (x=0.7) of thickness 101 Å separated layer 19 (x=11) of thickness 604.2 Å from layer 18 (x=0.15) of thickness 514.1 Å—all again in the composition Al$_x$Ga$_{1-x}$As—to yield a half wavelength period for 850 nm. wavelength emission.

Both approaches accomplish the desire-that of electrical conductivity increase in a manner to have least detrimental effect on device operation. Increased significant impurity in the upper mirror represents a reasonable compromise since any reflectance decrease is of lesser significance there. Similarly, use of intermediate bandgap material between mirror layers has a net positive effect. Further improvement may be realized by introduction of metal dopant, e.g. by elemental zinc which may be thermally diffused from the free surface.

As is known, interpositioning of intermediate bandgap material layers such as 21 and 22 substantially reduces electrical resistance while affecting reflectance only to a minor extent. See J. L. Jewell et al, "Optic. Engineering", vol. 29, p. 210 (1990). Optimized structures may interpose material on both sides of the mirror pair or may use many thin layers to produce a superlattice. As shown, the interposed steps are in the p-type side mirror where most needed. Under some circumstances, it may be desirable to reduce resistance in the n-type mirror as well by similar techniques.

FIG. 1 is illustrative only. A number of variations, as now practiced or as practiced in the future, may improve operation without affecting the inventive teaching. For example, while not implicitly shown, substrate layer 10 was, in the working example, coated with a thin layer of vapor deposited material of the identical composition to better assure a defect-free epitaxial growth surface.

FABRICATION

This section deals with fabrication steps of particular relevance to the inventive advance. While the order of the fabrication steps as practiced, as well as the precise nature of the steps themselves may be varied, it is convenient to discuss fabrication in terms of the procedures used in construction of the working example discussed above.

The top surface of the structure of FIG. 1 was provided with resist masking both atop the laser post. The purpose was both to mask underlying region from ion damage and to serve for lift-off definition of electrodes. For ion-damage conditions to be described, effective masking required masking layer thickness of $\approx 6$ μm. While conventional, single layer, photoresist lithography served to provide a working laser, a multilevel resist approach better assures vertical resist edges. A typical trilevel resist process as now practiced, entails a first photoresist layer of 5 or 6 μm thickness followed by $\approx 500$ Å thick layer of e.g. Cr or Au followed by a 1 μm thick photoresist layer. Following exposure and development to produce the desired pattern in the 1 μm layer, the metal layer is etched, using the top resist pattern as a mask. Dry etching, (e.g. reactive oxygen ion etching) of the thick underlying photoresist is carried out under conditions to obtain the desired vertical edges with the remaining metal serving as the mask.

Following photolithographic definition, 1000 Å thick electrode material (for the p-type side, Au/Zn) was deposited from an alloy source by therma evaporation. For the particular working example discussed above, the electrode layer was retained as a continuous layer during ion implantation.

Ion implantation is chosen such as to result in peak damage (peak resistance) at the depth of the active region and in lowest damage (lowest resistance) at the surface. Appropriate acceleration energies for various ion species are readily calculated. See, for example, "Ion Implantation—Science and Technology", edited by J. F. Ziegler, Academic Press (1984) pp. 51–108 (ISBN #0-12-780620-2). For the example in which the active gain region was at a depth of about 2.5 μm from the top surface, 300 keV H$^+$ ions for an implantation dose of $5 \times 10^{14}$ cm$^{-2}$ was effective in introducing damage sufficient to result in sheet resistance greater than $10^6$ ohms per square peaking at a depth of $\approx 2.3$ μm. Thermal annealing at 450° C. for thirty seconds reduced the lesser damage-induced resistance in the topmost 1.5 μm surface region to a sufficient extent for the results reported. Implantation/annealing conditions were not optimized in terms of minimum lasing threshold.

It is useful to consider both the nature and magnitude of implant damage. Two considerations are of primary consequence to the inventive teaching—1) the lateral damage gradient at the buried peak damage level which must both result in the gradient essential to the funnel-like current path to properly bias the active gain material while leaving the material within the laser pillar substantially undamaged and 2) the vertical damage gradient from the buried peak to the surface on which the ions are first incident in order, retain sufficient conductivity for desired lasing threshold. For H and He, assuming minimal spectral energy spread, the full damage width in GaAs (reasonably representative of contemplated semiconductor materials) is 0.5 μm. For these purposes, damage width is defined as encompassing the damaged region over which damage is at a minimum of 0.5 of maximum (for these purposes, the damaged region is considered circular with peak damage occurring at the center). For larger ions, such as that of O, the damage width is somewhat greater.

Under practical operating conditions, it has been possible to obtain peak buried damage at $\approx 2.3$ μm which is an order of magnitude greater than that within the first μm deep layer at the incident surface. As indicated, preferred procedures herein, which may entail annealing, somewhat increase this gradient. It is of some value to estimate the actual magnitude of the damage as introduced by contemplated dosage. For dose of $\approx 1 \times 10^{14}$ cm$^{-2}$, it is estimated that damage may peak at a level of $\approx 10^{19}$ cm$^{-3}$. As is well known to those familiar with these phenomena, such numbers are only approximate and, to a certain extent, may be even transitory—depending upon the degree of displacement, some fraction of the induced damage may self-anneal at operating temperatures.

The mechanism whereby damage is introduced by ion implantation is known, for example, from "Ion Implantation—Science and Technology" cited above. Statistically, a hydrogen atom displaces five dopant carriers so that the five metal dopant atoms, e.g. Be, do not substantially contribute to conductivity. While the statistical observation may be somewhat dependent on dopant density, to a first approximation, induced damage over the concerned region—from incident surface through peak depth—may be considered as linearly related to the collision profile. The order of magnitude 1 μm to 2.3 μm damage profile observed in the implant direction may, therefore, be representative of an $\approx$ order of magnitude collision profile.

From the operational standpoint, passage through the active gain region of a minimum of 50% of the introduced biasing current is generally obtainable with contemplated damage profiles. For most purposes, particularly for high degree of integration, this is a desirable minimum. Under certain conditions, biasing current passing through the active gain region has been at levels at 90% or better, again as expressed in terms of total biasing current introduced through the top electrode.

The minor conductivity impairment observed at the center of the laser pillar suggests that the damage gradient in the lateral direction is of the same order as that in the vertical direction. For an aperture of $\approx 5$ μm, this would suggest that the degree of angular deflection due to scattering again results in a $\approx$ order of magnitude decrease in implant-induced damage. This estimate, since based only on initial experimental results, must be considered only as approximate. It is likely that optimized conditions will result in a steeper lateral gradient to retain substantially unimpaired conductivity at the center of the pillar. As an example, use of a carefully controlled trilevel resist procedure will result in more nearly vertical resist edges to, in turn, produce more nearly uniform diameter electrode apertures.

A similar implant damage profile is obtainable with other ions such as He and O. For He, required implant energy and dose are 800 keV and $\approx 1 \times 10^{14}$ cm$^{-2}$, respectively. For O, required implant energy and dose are 3 MeV and $\approx 1 \times 10^{13}$ cm$^{-2}$, respectively.

The terminology "ion implantation" is conventionally used to describe the above procedure. Under most circumstances, damage centers indeed contain implanted material—in this instance, hydrogen. Thermal annealing, as practiced, is not expected to result in substantial evolution of the implanted material. Further, in general, annealing at sufficiently elevated temperature to liberate even hydrogen, cures the damage. The inventive teaching is not to be limited to any such assumed state, it being required only that resistance increase be realized by ion bombardment, and, in preferred instances, that resistance increase be lessened primarily in the region about the upper dielectric mirror by annealing.

Figure 2:
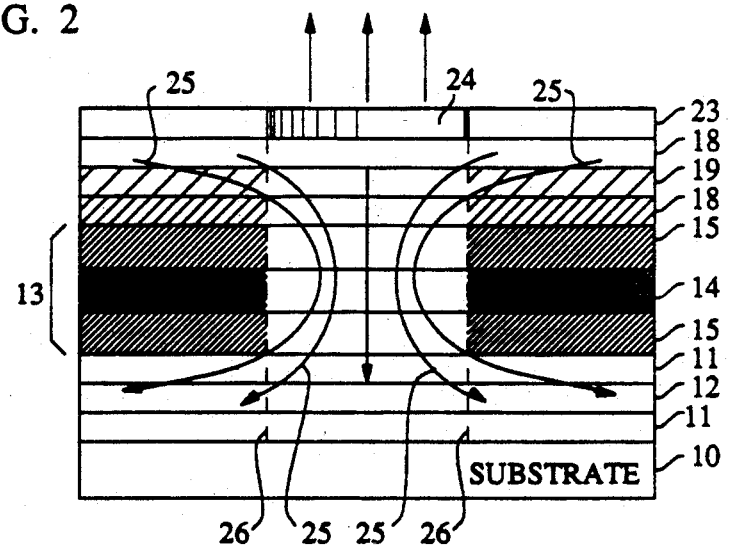
FIG. 2, again a schematic elevational view, depicts an operating device of the structure of FIG. 1 as completed.

Liftoff—for the working example, immersing in acetone or photoresist stripper (e.g. Baker PRS2000) at a temperature of 75° C. for a period of twenty minutes, completed the structure as depicted in FIG. 2. Specific conditions for providing substrate electrode contact are not critical to the inventive teaching.

Where lasers of the invention are part of integrated circuits, e.g. laser arrays, there is a need to isolate individual lasers. Physical isolation may take the usual form of chemical etching. Where electrodes were separated by liftoff, electrical isolation of individual lasers may be completed with wet chemical etching, perhaps to a depth of 2.5 $\mu$m using $H_3PO_4:H_2O_2:H_2O$ based etches. Ion implantation, now using a broad ion energy spectrum to realize reasonably constant damage from the surface to the depth of the active region, may accomplish the equivalent electrical isolation while maintaining planarity. (This is in contrast to the ion implantation damage serving to create the conductivity profile in which energy spectrum is deliberately narrow, and peaking at a value to produce the desired buried layer while only minimally affecting the first $\mu$m surface region.)

There are circumstances under which shallow etching of material surrounding the top of the laser may expedite processing. Etching—perhaps to a depth of 1000 Å units or less—may expedite locating the laser and aid in registration.

FIGS. 2-3

FIG. 2 is a front elevational view schematically representative of the structure of FIG. 1 now with top electrode 23 as provided with aperture 24 and also with bottom electrode not shown. To the extent that this figure is representative of the working example, it has been simplified, for example, by reduction in the number of mirror layers in the interest of simplifying discussion. The structure has now been implant-damaged in accordance with the inventive teaching with damage depicted in portions of layers 15, 18 and 19 surrounding the relatively undamaged active region within the laser column. Degree of damage is depicted in terms of shading with shading being most intense within layer 14 and diminishing in both directions through layers 15, 18 and 19. While not shown on the figure, implant damage in layers 11 and 12 adjacent active region 13 is of the same approximate magnitude as that of adjacent layers 18 and 19.

Broken lines 26 define the columnar portion of the overall structure (the "pillar") within which lasing occurs. This portion, the laser itself, is part of a larger layered structure with layers generally continuous-generally extending through the structure and enclosed columnar portion without interruption (although as described layer regions outside the column are selectively ion implant-damaged). As also described, there are circumstances under which shallow etching in the region surrounding the laser is useful—to such extend as many as ~10 surface layers may, in this sense, be discontinuous.

The columnar portion, which for the aperture 24 shown, is generally circular in cross-section, is physically defined primarily in terms of damage, which, in turn, is restricted to regions outside the columnar portion by the resist region used for liftoff. While for pedantic purposes, it is useful to show damage in terms of sharply demarked shading, actual damage is somewhat graded particularly at columnar surface 26. This is also true with respect to the layers, so that magnitude of damage does not change precipitously, but is, rather, gradually changing, e.g. between layers 14 and 15.

Figure 3:
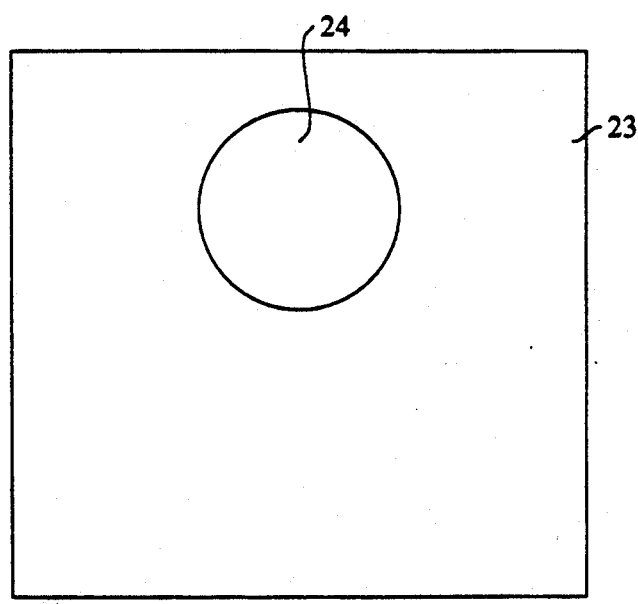
FIG. 3 is a plan view of a typical apertured electrode as used on the device of FIG. 2.
Figure 4:
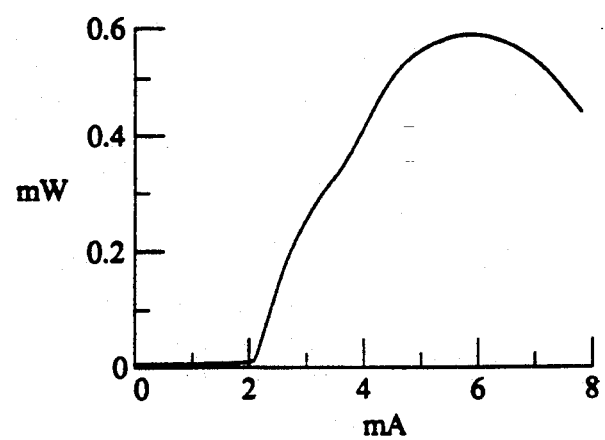
FIG. 4, on coordinates of output power and pump current, shows typical lasing threshold and lasing characteristics of a laser of the invention.

FIG. 3 is a top view of an electrode 23 including aperture 24. For the particular working example, the electrode, of elemental gold, was of 40 by 60 $\mu$m. The rectilinear configuration, as well as the offset aperture 24, are of no special consequence. A variety of design/operation considerations may dictate a different configuration. In general, a symmetrical electrode structure with largest area permitted (corresponding with the upper surface of the individual isolated devices) are preferred. Increased area results in reduced current density, and may lessen heat dissipation need particularly in structures in which the upper surface is that of the pdoped mirror.

The working example and other such devices that have been constructed were only gain-guided-guided in terms of peak current density in accordance with the damage-induced resistance profile. Such structures were optically unguided. This consideration results in a preference for laser columns, and, therefore, in aperture diameters sufficiently large to minimize optical edge scattering losses (which increase lasing threshold). Experimentally, thus far, pillar diameters of $\approx 5$ $\mu$m have been considered the minimum acceptable. As elsewhere discussed, however, fabrication procedures, as eventually optimized, may permit smaller diameter. A relevant consideration concerns etching—etching of the relatively thick ($\approx 6$ $\mu$m) resist used to effectively mask ion implantation, was done by simple wet etching. Resulting sloped edges likely result in corresponding variations in the electrode aperture as produced by liftoff. Substitution of a different etch technique, e.g. using a trilevel resist may result in more nearly vertical edges to achieve a pillar diameter closer to the nominal diameter. (For example, if sloping results in a least diameter aperture of $\approx 2$ or 3 $\mu$m for a nominal 5 $\mu$m dimension, it follows that the aperture size may be a uniform $\approx 2$ or 3 $\mu$m without sustaining additional edge loss). Experimentally, apertures of 5, 10, 15, 20 and 30 $\mu$m have functioned. Smaller apertures, even though sometimes requiring relatively larger electrodes are generally required, particularly in integrated circuits, for greater packing density.

FIG. 2 depicts the laser in its operating state with currents introduced from source not shown via electrode 23 resulting in current paths 25 which, in following the conductivity profile resulting from ion implant damage, converge within the active gain region within a laser column.

Not shown in FIG. 2 is the gold electrode plated on the underside of silicon substrate 10. In the working example the finished device was mounted on a copper plate.

FIG. 2 clearly depicts the structure and operating mode common to all devices of the invention. Under certain circumstances, where it may be desirable, for example, for monitoring purposes, it may be useful to provide for laser emission on the substrate side as well. Such may be accomplished by well known means, e.g. by removal of substrate in position locally corresponding with the columnar laser or by through-transmission where circumstances permit (e.g. where active gain material consists of InGaAs emitting at wavelength longer than the absorption region of a GaAs substrate.

FIG. 4

The power - current characteristic shown in this figure is of the general shape observed in SELs of the invention. The particular values correspond with a CW laser having a 10 μm diameter laser column (a 10 μdiameter electrode aperture). The particular device had a lasing threshold of 2.2 mA at room temperature. Up to 3.6 mA, the laser light is mostly horizontally polarized with a fundamental Gaussian transverse mode profile. Over 3.6 mA, vertically polarized light also begins to show up with characteristic TEM 01 mode shape. The kink at 3.6 mA in FIG. 2 shows the onset of a new transverse mode with vertical polarization. Above 5 mA, a circular doughnut-shaped mode is observed. Lassing wavelengths red-shift with currents, from 845 nm (at lasing threshold) to 847 nm (6 mA). A continuous output power of 0.6 mW is measured with 5.5 mA, without heatsink at room temperature. At higher currents, the output power decreases due to thermal effects as shown in FIG. 2. Differential quantum efficiency is about 20% for currents less than 3.6 mA and decreases for higher currents.

Using 150-ns pulses at 1% duty cycle, typical lasing thresholds are 2.2, 3.5, 5.6, and 10.2 mA for 10, 15, 20, and 30 μm diameters, respectively. The corresponding lasing threshold current densities per quantum well are 700, 500, 450 and 360 A/cm$^2$, respectively. Larger diameter lasers experience less diffraction and diffusion losses, which results in lower lasing threshold current densities. These threshold current densities per quantum well are only slightly higher than that of the lowest lasing threshold current single quantum well edge-emitting laser. Differential quantum efficiencies are about 20% for all sizes.

It has been convenient to discuss lasers of the invention largely in terms of discrete devices. As earlier stated, significant promise for the inventive advance is in the various forms of integration. The simplest such "integrated circuit" consists of a single SEL provided with necessary biasing circuitry. More complex circuits may take the form of all optical e.g. laser arrays, or alternatively, of optoelectronic integrated circuits (OE-ICs).

The inventive teaching is concerned with the implant damage-induced profile discussed. For expediency, teaching has been in terms of relatively simple devices, generally using GaAs-based active gain material. The teaching is applicable to many variations, some well known, some yet to emerge. Flexibility in laser emission wavelength is offered by use of other materials. See, for example, "long Wavelength Semiconductor Laser", by G. P. Agrawal and N. K. Dutta, Van Nostrand, Reinhold, N.Y. (1986), ISBN #0-442-2-0995-9 and "GaAs Technology", edited by D. K. Ferry, H. W. Sams, Inc., Indianapolis, In., (1985) ISBN #0-672-22375-9. These references describe a number of compound semiconductors, III-V and II-VI, as well as ternary and higher order compositions. Further flexibility is afforded by use of non-linear elements e.g. to increase or decrease frequency.

We claim:

1. In an apparatus comprising at least one electrically pumped, vertical cavity, surface emitting laser, said laser being a columnar portion of a larger layered structure constructed primarily of semiconductor material, substantially all of the layers of the said structure being continuous throughout the said columnar portion, said structure including in order, a substrate, a first multilayer dielectric mirror, an active region containing at least one layer of active gain material and a second multilayer dielectric mirror, both of said dielectric mirrors depending for reflectivity upon inclusion of a plurality of pairs of mirror layers of differing refractive index for the wavelength of laser emission, said mirrors being doped with significant impurity one such mirror region being doped p-type and the other n-type, said laser being provided with pumping means for electrically pumping active gain material to achieve lasing, said means including an electrode in electrical contact with said second multilayer dielectric mirror, said electrode being provided with an aperture permitting laser emission therethrough, characterized in that said larger structure has an electrical conductivity profile which causes current introduced into said electrode to follow a path, initially encompassing and non-enroaching on said columnar portion and subsequently encroaching on said columnar portion so that a significant part of such current passes through the said active gain region of said portion to achieve lasing, whereby laser emission passes through the said aperture, in which the said path is to a substantial extent a consequence of a buried region of increased electrical resistance, said region encompassing the said columnar portion and the said increased electrical resistance being the consequence of ion implantation damage.

2. Apparatus of claim 1 in which said active gain material consists essentially of a compound semiconductor.

3. Apparatus of claim 1 in which said at least one layer of active gain material is a quantum well.

4. Apparatus of claim 1 in which said at least one layer of active gain material is sandwiched between layers of spacer material, said spacer material being a non-gain material in terms of lasing.

5. Apparatus of claim 1 in which resistance is graded downwardly by at least one order of magnitude from a maximum value at the peak resistance of the said buried region to a lesser value within a region of the second layered dielectric mirror near the said electrode.

6. Apparatus of claim 5 in which the ion implantation damage consists essentially of hydrogen ion implantation damage as indicated by inclusion of hydrogen in concentration approximately scaling with the degree of implantation damage.

7. Apparatus of claim 1 in which conductivity doping is substantially uniform within layers of the said larger layered structure.

8. Apparatus of claim 7 in which doping is graded in a direction orthogonal to the layers of the said larger layered structure with at least the mirror layer nearest to the said electrode more heavily doped than the mirror layers embracing the said active region.

9. Apparatus of claim 8 in which the mirror layer nearest to the said electrode is doped to approximately the maximum permitted short of resulting in significant device consequent impairment.

10. Apparatus of claim 1 in which said active gain material consists essentially of GaAs.

11. Apparatus of claim 1 in which said active gain material consists essentially of In$_x$Ga$_{1-x}$As.

12. Apparatus of claim 1 in which said active gain material consists essentially of Al$_x$Ga$_{1-x}$As.

13. Fabrication of apparatus comprising at least one electrically pumped, vertical cavity, surface emitting laser comprising epitaxially growing upon a substrate a structure comprising a plurality of layers consisting essentially of semiconductor material, said layers forming in order of growth a first multilayer dielectric mirror, an active region containing at least one layer of active growth material and a second multilayer dielectric mirror, said mirrors being oppositely doped with significant conductivity impurity, the said structure being larger than the said laser as measured within substantially all of the grown layers, characterized in that the said structure is bombarded with accelerated ions of such energy magnitude and distribution as to produce a buried ion-implanted damage region encompassing the said laser, the damage profile so produced defining a resistivity profile such that introduction of current peripheral to the laser at the final growth layer results in a primary current path through the active region to cause lasing.

14. Fabrication of claim 13 in which the upper layer of the said laser is masked by material including patterned resist so as to lessen ion-implant damage within the said laser.

15. Fabrication of claim 14 in which said patterned resist is covered by a continuous layer of electrode material during bombardment and in which electrode material above the patterned resist is removed subsequent to bombardment by liftoff.

* * * * *